(12) United States Patent
Chaturvedula et al.

(10) Patent No.: US 7,844,929 B2
(45) Date of Patent: Nov. 30, 2010

(54) OPTIMIZING TEST CODE GENERATION FOR VERIFICATION ENVIRONMENT

(75) Inventors: Kavitha Chaturvedula, San Jose, CA (US); Juergen K. Lahner, Morgan Hill, CA (US); Balamurugan Balasubramanian, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 195 days.

(21) Appl. No.: 12/117,381

(22) Filed: May 8, 2008

(65) Prior Publication Data

US 2009/0282307 A1    Nov. 12, 2009

(51) Int. Cl.
    *G06F 17/50* (2006.01)

(52) U.S. Cl. .............................. 716/4; 716/1

(58) Field of Classification Search .............. 716/1, 716/4
See application file for complete search history.

(56) References Cited

U.S. PATENT DOCUMENTS

| | | | |
|---|---|---|---|
| 7,315,973 B1* | 1/2008 | Wise | 714/741 |
| 7,526,742 B1* | 4/2009 | Edwards | 716/5 |
| 2001/0010091 A1* | 7/2001 | Noy | 716/4 |
| 2006/0229860 A1* | 10/2006 | Azatchi et al. | 703/14 |
| 2009/0018793 A1* | 1/2009 | Sakarovitch et al. | 702/123 |
| 2010/0088278 A1* | 4/2010 | Wood et al. | 707/638 |

* cited by examiner

*Primary Examiner*—Jack Chiang
*Assistant Examiner*—Suchin Parihar
(74) *Attorney, Agent, or Firm*—Christopher P. Maiorana, PC

(57) ABSTRACT

A method of optimizing test code generation is disclosed. The method generally includes the steps of (A) reading from a database (i) a plurality of assertions, (ii) a testbench and (iii) a target code coverage all of a design under test, (B) generating together (i) a plurality of first test vectors to test the assertions and (ii) a plurality of second test vectors applicable to the testbench, (C) identifying one or more redundant test vector sets between the first test vectors and the second test vectors and (D) generating the test code to test the design under test on the testbench using a subset of the first test vectors and the second test vectors, the subset comprising single instances of the redundant test vector sets.

20 Claims, 5 Drawing Sheets

OPTIMIZING TEST CODE GENERATION FOR VERIFICATION ENVIRONMENT

FIELD OF THE INVENTION

The present invention relates to electronic circuit design testing generally and, more particularly, to a method and/or apparatus for optimizing test code generation for a verification environment.

BACKGROUND OF THE INVENTION

Referring to FIG. 1, a diagram of a conventional test environment 10 is shown. The test environment 10 verifies the functionality of a design under test (DUT) 14 using a functional model to generate 12 test vectors, sends the test vectors to the DUT 14 and validates 16 the outputs of the design when stimulated by the test vectors. System Verilog/Property Specification Language assertions are being used for smaller parts of the test vector suites to formally verify the test vectors for functionality while the design is under development. However, the current simulation tools do not take the assertions and testbenches in to account simultaneously when calculating the test vector coverage. Therefore, the number of test vectors that would sufficiently test the design is often much less than the actual number of test vectors in use. As such, many redundant test are performed.

Currently no way exists to simultaneously analyze (i) the test vectors from assertions and (ii) the test vectors from testbenches to calculate the resulting coverage. The two test vector sets are commonly treated independently. Conventional methods of testing the design involve writing exhaustive testbenches and independently writing exhaustive assertions to assure that all parts of the design are tested. The conventional methods are inefficient because the test vectors from assertions and the test vectors from the testbenches are not analyzed simultaneously, which leads to redundancy. Furthermore, the redundant testing causes longer run times and longer turn-around-times for the functional verifications.

SUMMARY OF THE INVENTION

The present invention concerns a method of optimizing test code generation. The method generally includes the steps of (A) reading from a database (i) a plurality of assertions, (ii) a testbench and (iii) a target code coverage all of a design under test, (B) generating together (i) a plurality of first test vectors to test the assertions and (ii) a plurality of second test vectors applicable to the testbench, (C) identifying one or more redundant test vector sets between the first test vectors and the second test vectors and (D) generating the test code to test the design under test on the testbench using a subset of the first test vectors and the second test vectors, the subset comprising single instances of the redundant test vector sets.

The objects, features and advantages of the present invention include providing a method and/or apparatus for optimizing test code generation for a verification environment that may (i) reduce turn-around-time in functional simulations, (ii) improve run times by reducing redundancy in the test vectors, (iii) enable additional efforts to be spent on improving testing coverage and/or (iv) enable additional efforts to be spent to improving a quality of the test code.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Functional verification and generation of test vectors to verify a design of a device may be time consuming. The present invention generally reduces a turn-around-time in the functional verification by eliminating redundancy among (i) test vectors created to test assertions and (ii) test vectors created to test functionality via a testbench. Each of the assertions may comprise a respective statement of a true relationship between at least two signals of the design during testing. For example, if a design includes two signals (e.g., A and B), an assertion may be created that a value A in the signal A matches a value B in the signal B at a specific time is a true statement concerning the design. Assertion test vectors may be written to control the signal A and the signal B at the specific time during a simulation. If the signal A matches the signal B at the specific time (e.g., value A=value B), the assertion passes. If the signal A does not match the signal B at the specific time (e.g., value A≠value B), the assertion fails and the simulation may generate an error message. Other assertions may be implemented to meet the criteria of a particular application. Since the assertion test vectors may cover functional verification for parts of the design, some sets of assertions test vectors of a final test code may be redundant with similar sets of functional test vectors. The testbench generally comprises a model of the design and a plurality of declarations of input signals of the design and output signals of said design, including but not limited to, bidirectional input/output signals.

Figure 1:
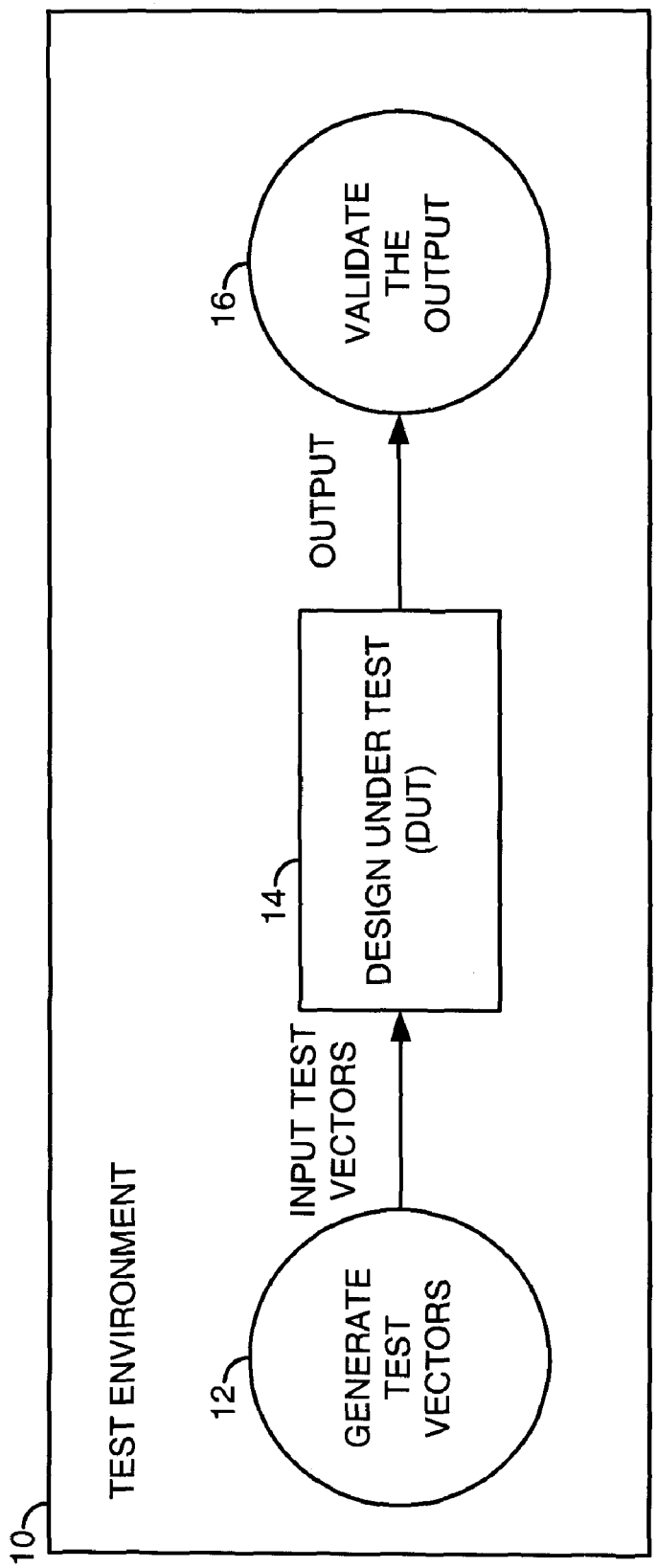
FIG. 1 is a diagram of a conventional test environment.
Figure 2:
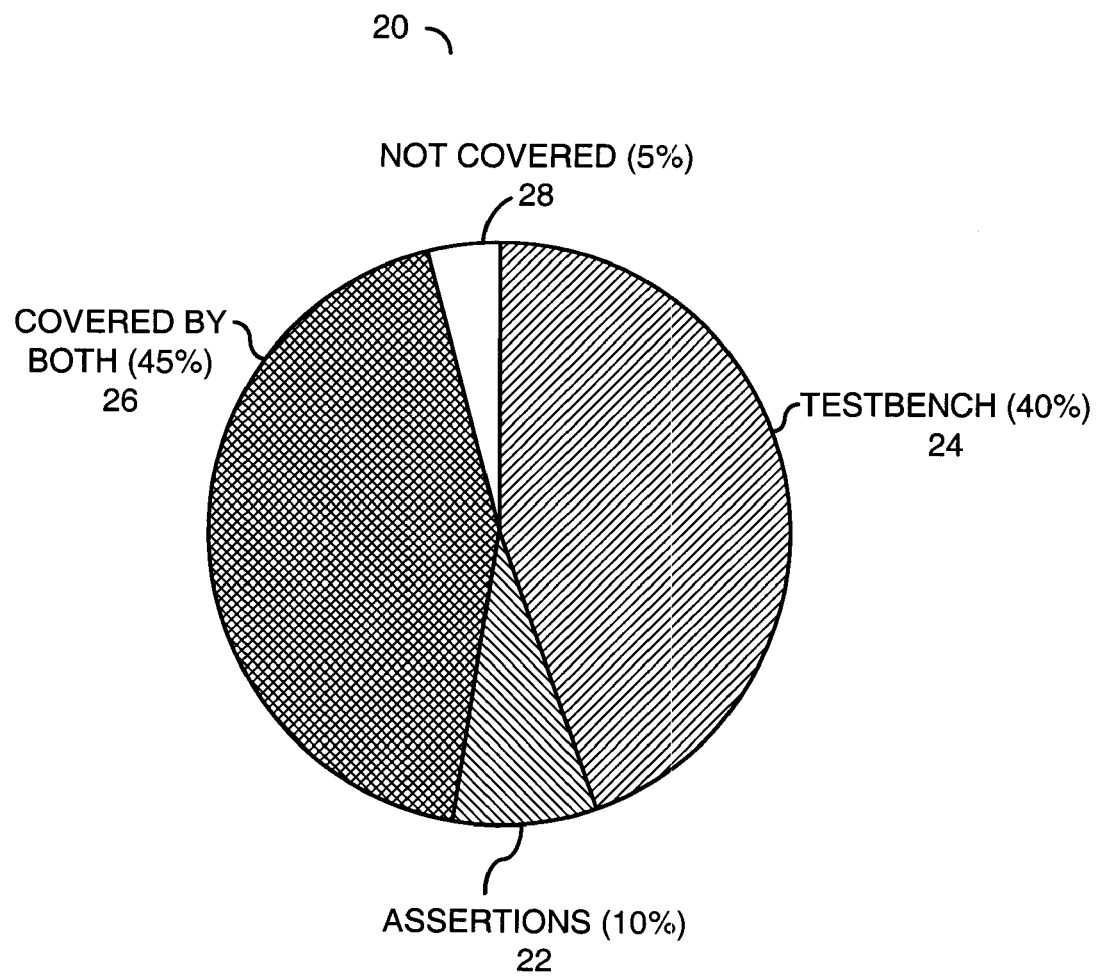
FIG. 2 is a first chart illustrating an example test code coverage using a conventional approach.
Figure 3:
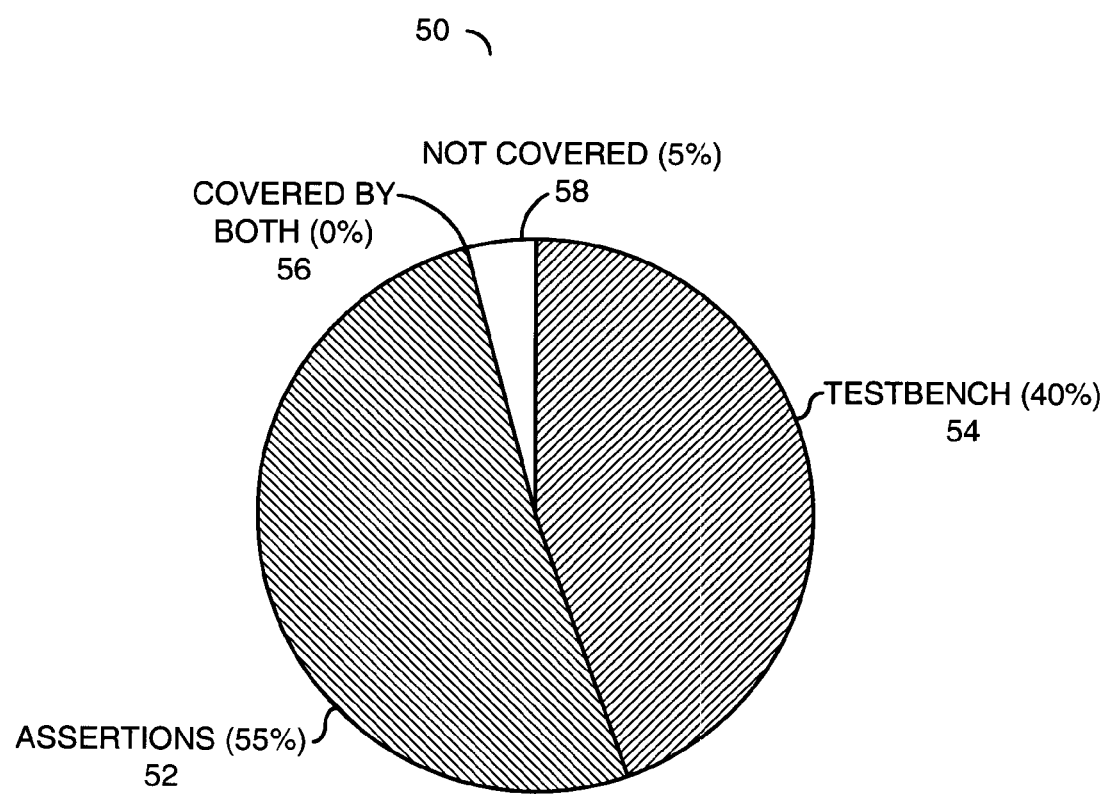
FIG. 3 is a second chart illustrating an example test code coverage using the present invention.

Referring to FIG. 2, a first chart 20 illustrating an example test code coverage using a conventional approach is shown. Referring to FIG. 3, a second chart 50 illustrating an example test code coverage using the present invention is shown. Consider a case in which a total code coverage goal is a predetermined percentage (e.g., 95%) of the design. FIG. 2 shows a coverage 22 (e.g., 10%) of the assertion test vectors 22 alone, a coverage 24 (e.g., 40%) of the testbench test vectors 24 alone, an overlap coverage 26 (e.g., 45%) by both the testbench test vectors and the assertion test vectors and a non-covered (e.g., 5%) portion 28 of the design. Under the present invention, FIG. 3 generally shows a coverage 52 (e.g., 55%) of the assertion test vectors alone, a coverage 54 (e.g., 40%) of the testbench test vectors alone, no overlap 56 (e.g., 0%) between the assertion test vectors and the testbench test vectors and a non-covered (e.g., 5%) portion 58. By implementing the present invention, the overlap either does not exist or has been reduced and yet the overall test coverage may remain the same. Therefore, additional testbench test vectors commonly used in the overlap region 26 (e.g., 45%) may now be removed.

Figure 4:
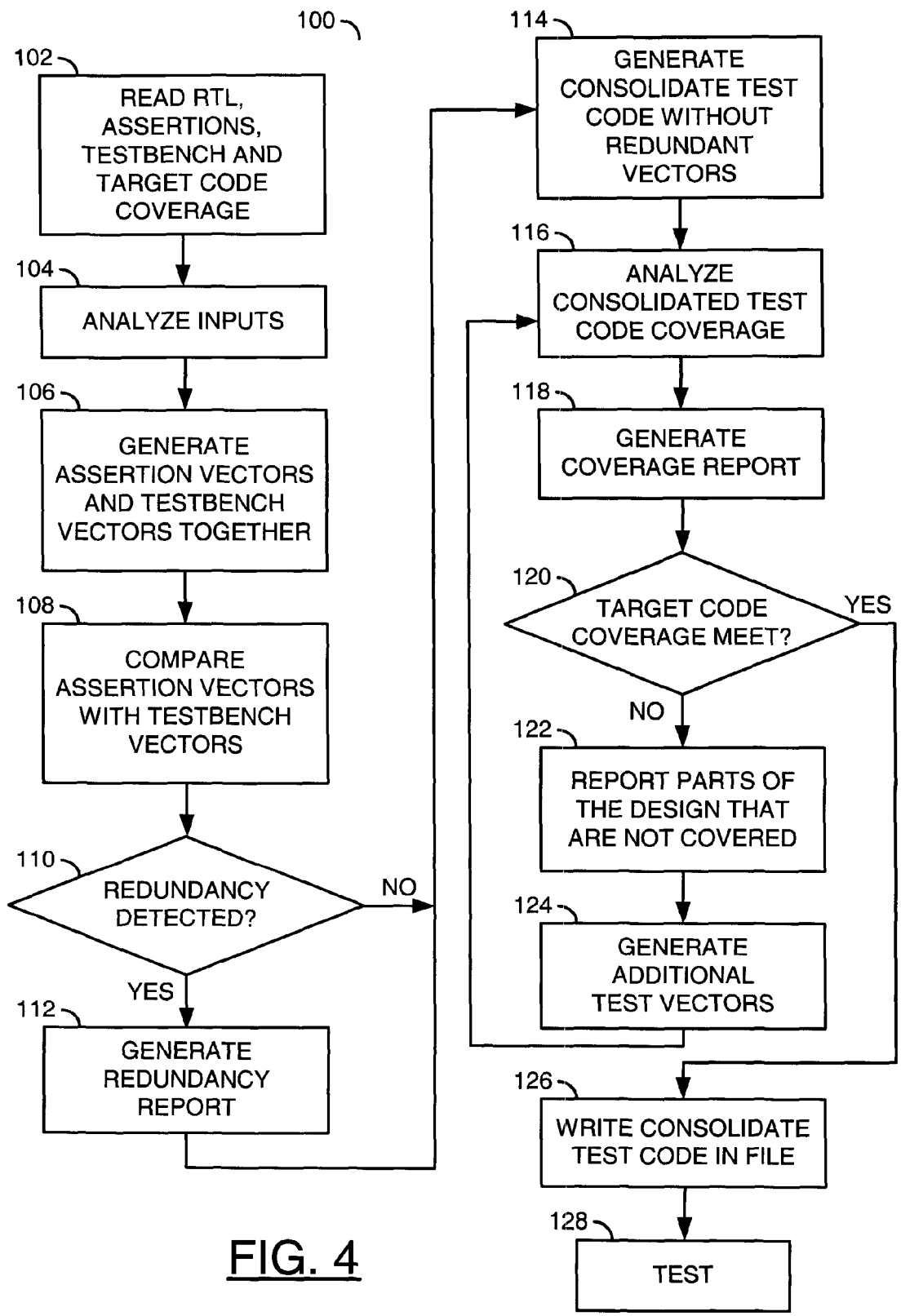
FIG. 4 is a flow diagram of an example test code optimization method in accordance with a preferred embodiment of the present invention.

Referring to FIG. 4, a flow diagram of an example method 100 is shown in accordance with a preferred embodiment of the present invention. The method (or process) 100 generally implements a technique for optimizing test code generation for a verification environment. The method 100 may comprise a step (or block) 102, a step (or block) 104, a step (or block) 106, a step (or block) 108, a step (or block) 110, a step (or block) 112, a step (or block) 114, a step (or block) 116, a step (or block) 118, a step (or block) 120, a step (or block) 122, a step (or block) 124, a step (or block) 126 and a step (or block) 128. The method 100 may be implemented as a computer program executing on a processor in a computer.

In the step 102, at least (i) the design under test in an appropriate modeling language (e.g., Register Transfer Language (RTL), Verilog or the like), (ii) the assertions associated with the design, (iii) the testbench associated with the design and (iv) a target code coverage information may be read from a storage medium (e.g., hard drive, memory, server, database or the like). The target code coverage may be implemented as an overall coverage percentage of the device and/or coverage information for (i) each of the sub-modules within the device and/or (ii) each of the functions performed by the device. Additional information related to the design may be read from the storage medium to meet the criteria of a particular application.

The design code, assertions, testbench and target code coverage may be analyzed in the step 104 to determine what aspects of the design should be covered by the test code. In the step 106, both the testbench test vectors and the assertion test vectors may be generated in parallel. Generation of all of the test vectors substantially simultaneously under the present invention may differ from common test vectors generation approaches where the testbench test vectors are generated independently from the assertion test vectors. As such, early indications of redundant test vectors may be identified and the redundancy eliminated or reduced.

Sets of assertion test vectors may be compared with corresponding sets of testbench test vectors in the step 108. Each set of test vectors generally comprises a sequence of several test vectors that establishes a target condition in the design under test. In some cases, a set of test vectors may be as small as a single test vector (e.g., activation of a system-wide reset).

Structured and focused strategies which is an example of an analysis based approach may be applied to identify and remove the redundancies. For instance, various functions, such as dual data rate memory interfaces or any other application, may be verified with an assertion based approach and/or a simulation based approach. Both techniques may often achieve similar results as both may be based on (i) the same functional specification and (ii) a well defined sequence of control signals and data signals. The sequences of test vectors may be broken down into smaller parts which may be verified with a single approach (e.g., assertion or simulation) and not both.

If one or more sets of assertion test vectors are found to be redundant with a corresponding set of testbench test vectors (e.g., the YES branch of step 110), the method 100 may generate a redundancy report for a user in the step 112. The redundancy report generally includes identifications of each redundant set of test vectors. Afterwards, or in parallel, a consolidated test code containing the non-overlapping assertion test vectors and the non-overlapping testbench test vectors may be created in the step 114. The resulting test code may contain a single instance of each set of redundant test vectors. If no redundancy is detected (e.g., the NO branch of step 110), the method 100 may skip the redundancy report and generate the test code in the step 114.

In the step 116, the test code may be analyzed against the design to determine the actual test coverage achieved. The actual coverage may be provided to the user in the step 118 as a coverage report. If the achieved coverage does not meet the target code coverage (e.g., the NO branch of step 120), an error report may be generated in the step 122 identifying the portions of the design that should be, but are not covered by the test code. The coverage report may assist in guiding the user to generate a minimal set of test vectors appropriate for the existing assertions to achieve the target code coverage. The coverage report may also provide guidance to the user in improving the test code coverage.

In the step 124, additional test vectors may be added to the test code in order to fill the gaps in the test coverage identified in the coverage report. Afterwards, the updated test code may be re-analyzed in the step 116 and a new coverage report generated in the step 118. Once the target code coverage is meet by the test code (e.g., the YES branch of step 120), the test code may be written into a file in a storage medium in the step 126. The file may be used by a simulator to conduct testing of the design under test in the step 128.

Figure 5:
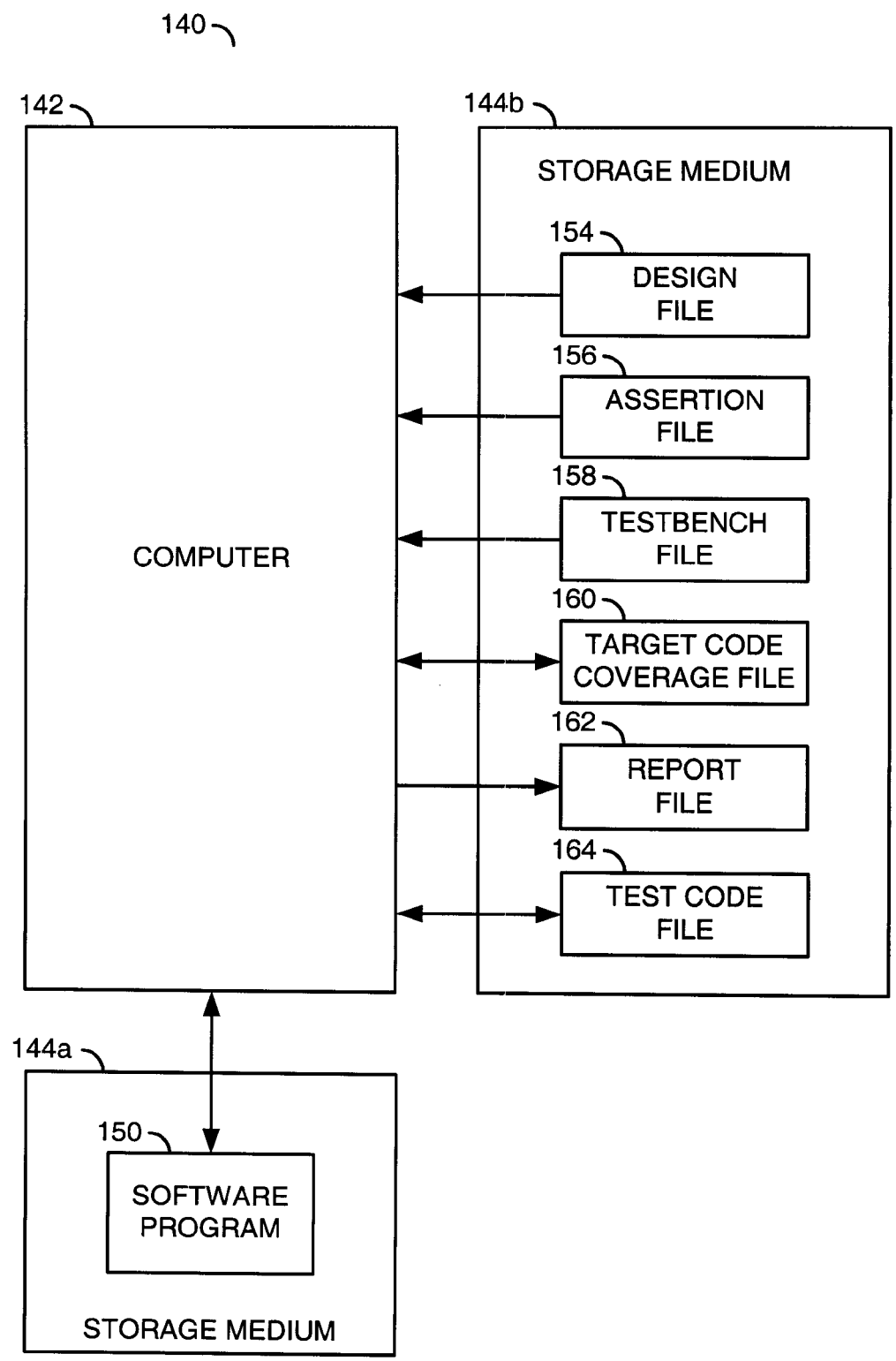
FIG. 5 is a block diagram of an example apparatus implementing the test code optimization method.

Referring to FIG. 5, a block diagram of an example apparatus 140 implementing the test code optimization method 100 is shown. The apparatus 140 may be implemented as a computer 142 and one or more storage media 144a-144b. A storage medium 144a may store a software program 150. The software program 150 may define the steps of generating the test code, analyzing, comparing generating the reports, running the simulations and such (see FIG. 4). The storage medium 144b may store a file 154, a file 156, a file 158, a file 160, one or more files 162 and a file 164. The file 154 may contain the RTL code of the design under test. The file 154 may contain assertions corresponding to the design under test. The file 156 may contain the testbench for the design under test. The file 160 may contain the test code coverage information to be used by the software program 150 to determine if the target goals have been meet. The files 162 may contain the reports. The file 164 may contain the test code generated for the device.

The software program 150 may be read and executed by the computer 142. The computer 142 and program 150 may access the data in the files 154-160 to perform the test code optimization for the design. Intermediate and final versions of the test code may be written into the file 164.

The present invention may be used for any system which uses assertions as well as test vectors for verification. The present invention may also be used to guide the testbench generation early in the design flow by identifying the areas for assertions and testbench.

The functions performed by the flow diagram of FIG. 4 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMs, RAMs, EPROMS, EEPROMs, Flash memory, magnetic or optical cards, or any type of media suitable for storing electronic instructions. As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the scope of the invention.

The invention claimed is:

1. A method of optimizing test code generation, comprising the steps of:
   (A) reading from a database to an apparatus (i) a plurality of assertions of a design under test, (ii) a model of said design under test and (iii) a target test coverage of said design under test;
   (B) generating in parallel (i) a plurality of first test vectors to test said assertions and (ii) a plurality of second test vectors to test said model;
   (C) identifying one or more redundant test vector sets between said first test vectors and said second test vectors; and
   (D) generating said test code to test said design under test, wherein (i) said test code comprises a subset of a sum of said first test vectors and said second test vectors and (ii) said subset excludes duplicate instances of said redundant test vector sets.

2. The method according to claim 1, further comprising the step of:
   analyzing a coverage of said test code against said design under test to determine a portion of said design under test not covered by said test code.

3. The method according to claim 2, further comprising the step of:
   writing said test code in a file where said coverage exceeds said target test coverage.

4. The method according to claim 2, further comprising the step of:
   generating an error report identifying said portion of said design under test not covered by said test code where said coverage is less than said target test coverage.

5. The method according to claim 2, further comprising the step of:
   adding a plurality of additional test vectors to said test code to test said portion of said design under test.

6. The method according to claim 5, further comprising the step of:
   re-analyzing said coverage of said test code against said design under test after adding said additional test vectors.

7. The method according to claim 1, wherein said identifying of said one or more redundant test vector sets utilizes at least one of (i) an analysis based approach and (ii) a simulation based approach.

8. The method according to claim 1, further comprising the step of:
   dividing both said first test vectors and said second test vectors into a plurality of sequences, wherein said identifying of said one or more redundant test vector sets utilizes a single one of (i) an analysis based approach and (ii) a simulation based approach on said sequences.

9. The method according to claim 1, wherein each of said assertions comprise a respective statement of a true relationship between at least two signals of said design under test during testing.

10. The method according to claim 1, wherein said model of said design under test comprises a plurality of declarations of (a) input signals of said design under test and (b) output signals of said design under test.

11. An apparatus comprising:
   a database storing a plurality of assertions of a design under test, a model of said design under test and a target test coverage of said design under test; and
   a processor configured to (i) read from said database (a) said assertions, (b) said model and (c) said target test coverage, (ii) generate in parallel (a) a plurality of first test vectors to test said assertions and (b) a plurality of second test vectors to test said model, (iii) identify one or more redundant test vector sets between said first test vectors and said second test vectors and (iv) generate said test code to test said design under test, wherein (a) said test code comprises a subset of a sum of said first test vectors and said second test vectors and (b) said subset excludes duplicate instances of said redundant test vector sets.

12. The apparatus according to claim 11, said processor being further configured to analyze a coverage of said test code against said design under test to determine a portion of said design under test not covered by said test code.

13. The apparatus according to claim 12, the processor being further configured to write said test code in a file where said coverage exceeds said target test coverage.

14. The apparatus according to claim 12, the processor being further configured to generate an error report identifying said portion of said design under test not covered by said test code where said coverage is less than said target test coverage.

15. The apparatus according to claim 12, the processor being further configured to add a plurality of additional test vectors to said test code to test said portion of said design under test.

16. The apparatus according to claim 15, the processor being further configured to re-analyze said coverage of said test code against said design under test after adding said additional test vectors.

17. The apparatus according to claim 11, wherein said identifying of said one or more redundant test vector sets utilizes at least one of (i) an analysis based approach and (ii) a simulation based approach.

18. The apparatus according to claim 11, the processor being further configured to divide both said first test vectors and said second test vectors into a plurality of sequences, wherein said identifying of said one or more redundant test vector sets utilizes a single one of (i) an analysis based approach and (ii) a simulation based approach on said sequences.

19. The apparatus according to claim 11, wherein each of said assertions comprise a respective statement of a true relationship between at least two signals of said design under test during testing.

20. A non-transitory storage medium for use in a computer to optimize test code generation, the storage medium recording a computer program that is readable and executable by the computer, when executed the computer program comprising the steps of:
   (A) reading from a database (i) a plurality of assertions of a design under test, (ii) a model of said design under test and (iii) a target test coverage of said design under test;
   (B) generating in parallel (i) a plurality of first test vectors to test said assertions and (ii) a plurality of second test vectors to test said model;

(C) identifying one or more redundant test vector sets between said first test vectors and said second test vectors; and (D) generating said test code to test said design under test, wherein (i) said test code comprises a subset of a sum of said first test vectors and said second test vectors and (ii) said subset excludes duplicate instances of said redundant test vector sets.

* * * * *